(12) United States Patent
Smith et al.

(10) Patent No.: US 12,112,804 B2
(45) Date of Patent: Oct. 8, 2024

(54) INTERLEAVED STRING DRIVERS, STRING DRIVER WITH NARROW ACTIVE REGION, AND GATED LDD STRING DRIVER

(71) Applicant: Micron Technology, Inc., Boise, ID (US)

(72) Inventors: Michael A. Smith, Boise, ID (US); Martin W. Popp, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 18/237,070

(22) Filed: Aug. 23, 2023

(65) Prior Publication Data

US 2023/0395151 A1     Dec. 7, 2023

Related U.S. Application Data

(62) Division of application No. 17/401,239, filed on Aug. 12, 2021, now Pat. No. 11,783,896.

(51) Int. Cl.
| | | |
|---|---|---|
| G11C 16/14 | (2006.01) | |
| G11C 16/04 | (2006.01) | |
| G11C 16/08 | (2006.01) | |
| H01L 29/10 | (2006.01) | |
| H01L 29/78 | (2006.01) | |

(52) U.S. Cl.
CPC .......... *G11C 16/08* (2013.01); *G11C 16/0483* (2013.01); *H01L 29/1083* (2013.01); *H01L 29/7833* (2013.01)

(58) Field of Classification Search
CPC ................ G11C 16/08; G11C 16/0483; H01L 29/1083; H01L 29/7833; H01L 29/0692; H01L 29/1045; H01L 29/7834
See application file for complete search history.

(56) References Cited

U.S. PATENT DOCUMENTS

| | | | |
|---|---|---|---|
| 2009/0168529 A1* | 7/2009 | Yamada ................. | H10B 41/60 438/257 |
| 2010/0067300 A1* | 3/2010 | Nakamura ............. | G11C 16/16 365/185.11 |
| 2018/0182767 A1* | 6/2018 | Kawashima ........ | H01L 29/4234 |
| 2019/0035466 A1* | 1/2019 | Kim ................... | G11C 16/0483 |
| 2021/0202506 A1* | 7/2021 | Liu ................... | H01L 21/26513 |
| 2021/0391315 A1 | 12/2021 | Zhang | |
| 2022/0310169 A1 | 9/2022 | Liang et al. | |
| 2023/0050443 A1 | 2/2023 | Smith et al. | |

* cited by examiner

*Primary Examiner* — Hien N Nguyen
(74) *Attorney, Agent, or Firm* — Perkins Coie LLP

(57) ABSTRACT

A memory device includes a first string driver circuit and a second string driver circuit that are disposed laterally adjacent to each other in a length direction of a memory subsystem. The first and the second string driver circuits are disposed in an interleaved layout configuration such that the first connections of the first string driver are offset from the second connections of the second string driver in a width direction. For a same effective distance between the corresponding opposing first and second connections, a first pitch length corresponding to the interleaved layout configuration of the first and second string drivers is less by a predetermined reduction amount than a second pitch length between the first and second string drivers when disposed in a non-interleaved layout configuration in which each of the first connections is in-line with the corresponding second connection.

10 Claims, 9 Drawing Sheets

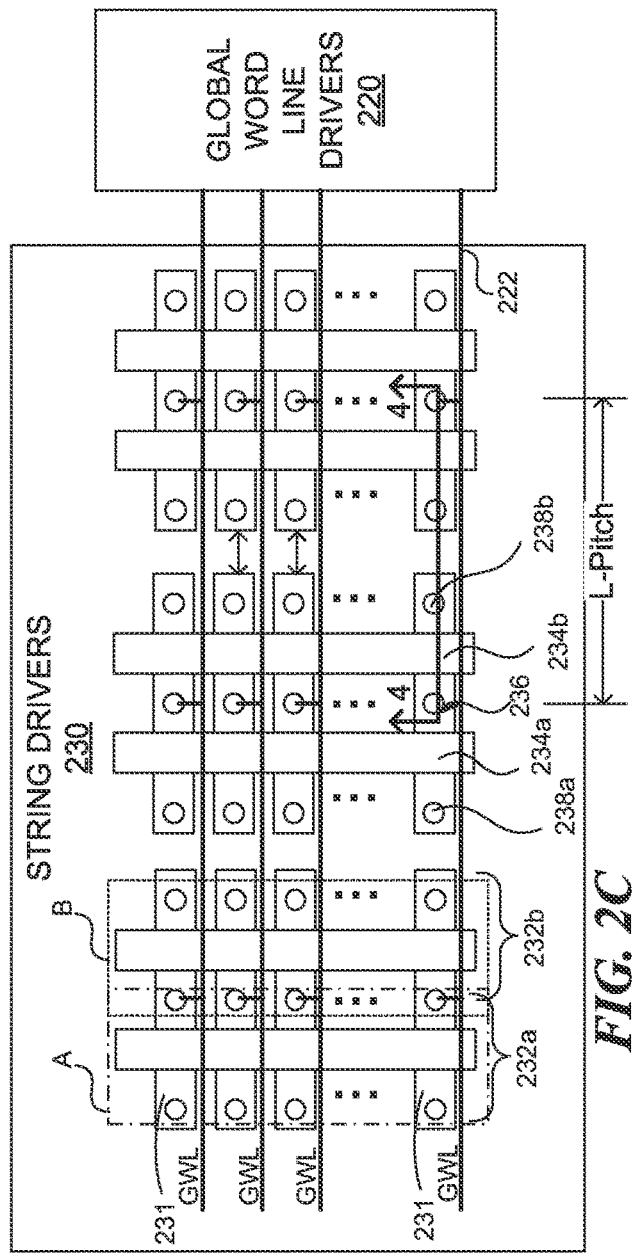
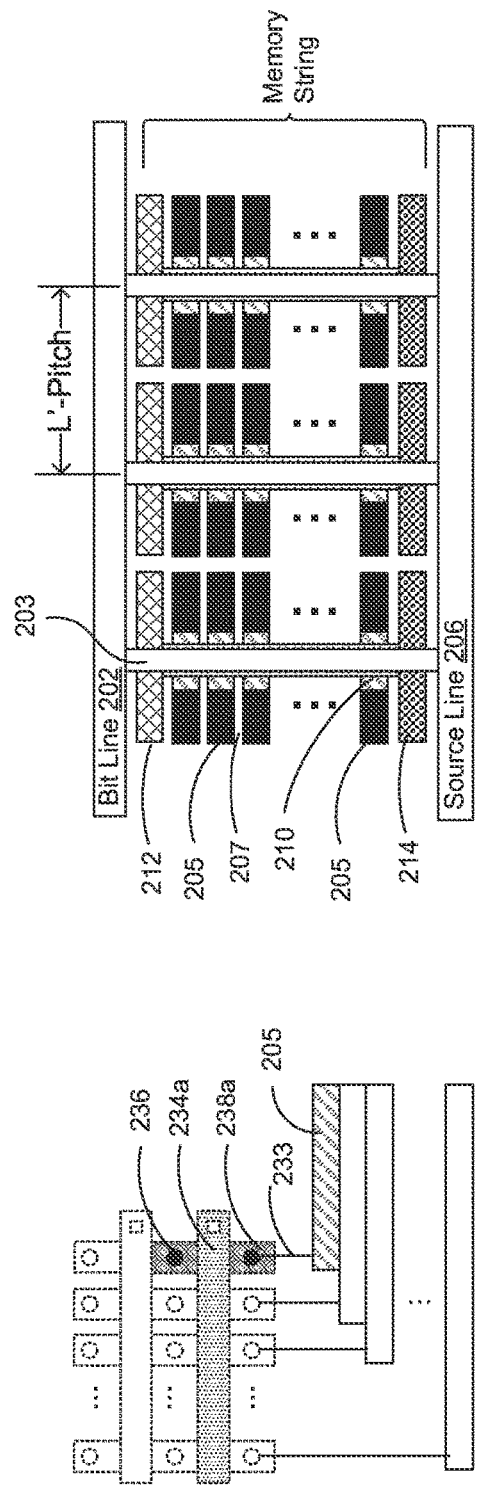
FIG. 2C
FIG. 2B
FIG. 2D

INTERLEAVED STRING DRIVERS, STRING DRIVER WITH NARROW ACTIVE REGION, AND GATED LDD STRING DRIVER

CROSS-REFERENCE TO RELATED APPLICATION(S)

This application is a divisional of U.S. patent application Ser. No. 17/401,239, filed Aug. 12, 2021, which is incorporated herein by reference in its entirety.

TECHNICAL FIELD

The present disclosure generally relates to an apparatus with string drivers, and more particularly, interleaved string drivers and string drivers with a narrow active region around contact. The present disclosure also relates to string drivers configured to include gated lightly doped drains (LDDs).

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), static random access memory (SRAM), and flash memory. As memory devices advance, it is desirable to make memory devices, including memory subsystems, as small and/or as dense as possible.

For the reasons stated above, and for other reasons stated below which will become apparent to those skilled in the art upon reading and understanding the present specification, there is a need in the art for memory subsystems that allow for smaller pitches.

BRIEF DESCRIPTION OF THE DRAWINGS

FIG. 2B illustrates a cross-section view of section 2B-2B of the memory array circuit in FIG. 2A.

FIG. 2C illustrate a top plan view of a simplified layout diagram of string drivers in accordance with the present disclosure.

FIG. 2D illustrates a cross-section view of section 2D-2D of the memory array circuit in FIG. 2A illustrating a word line "stair" configuration.

DETAILED DESCRIPTION

Figure 1:
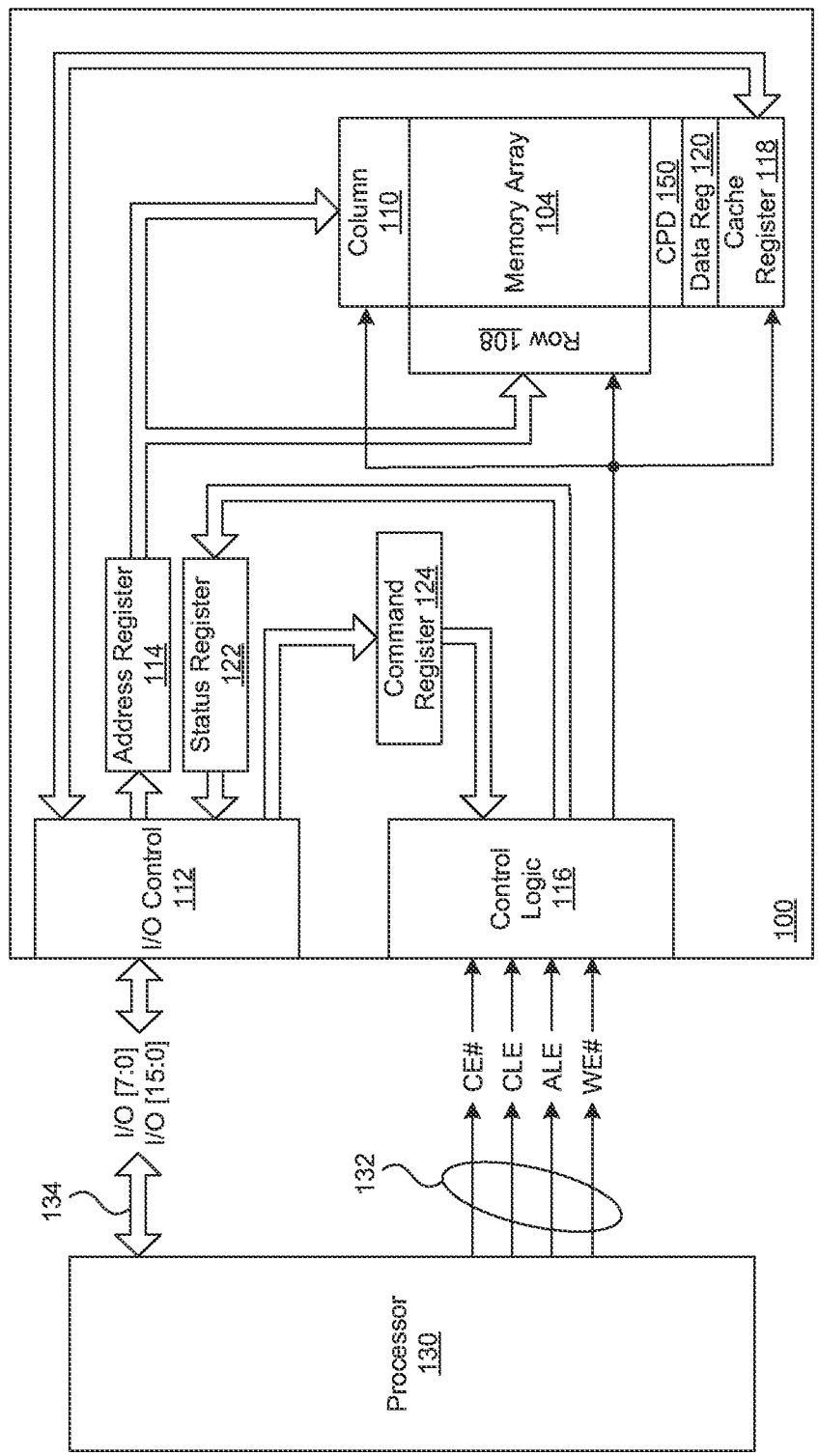
FIG. 1 illustrates a block diagram of an embodiment of a memory system in accordance with the present disclosure.

Embodiments of the present technology are directed to memory devices, systems including memory devices. In one embodiment, a memory device includes a memory array having a plurality of memory cells and a row decoder circuit that is configured to provide at least one row select signal for selecting corresponding word lines for memory operations on the plurality of memory cells. The row decoder circuit can include string drivers that are interleaved and/or have narrow active regions around their respective contacts. In addition, the memory device can have string drivers with a gated LDD configuration.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Some exemplary embodiments of the present disclosure can be directed to a memory device such as, for example, a flash memory device. Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the memory cells, through programming (which is sometimes referred to as writing) of charge-storage structures (e.g., floating gates or charge traps) or other physical phenomena (e.g., phase change or polarization), determine the data value of each memory cell. Common uses for flash memory and other non-volatile memory may include personal computers, personal digital assistants (PDAs), digital cameras, digital media players, digital recorders, games, appliances, vehicles, wireless devices, mobile telephones, and removable memory modules, and the uses for non-volatile memory continue to expand.

The present disclosure is directed to a memory device having an array of memory cells. The memory device includes a plurality of bit-lines with each bit-line connected to a respective set of memory cells of the array of memory cells. In an embodiment of the present disclosure, an apparatus includes a plurality of memory strings with each memory string including a plurality of local word lines connected to corresponding memory cells to form a memory cell array. The apparatus can include a memory subsystem having a first string driver circuit with first connections and a second string driver circuit with second connections. Each of the first connections and each of the second connections can be adapted to connect to respective local word lines of the plurality of local word lines. The first and second string driver circuits can be disposed laterally adjacent to each other in a length direction of the memory subsystem such that each of the first connections is disposed opposite a corresponding second connection. The first and the second string driver circuits can be disposed in an interleaved layout configuration such that each of the first connections is offset from the corresponding second connection in a width direction of the memory system by a predetermined distance that is greater than zero, with the width direction being perpendicular to the length direction. For a same effective distance between the corresponding opposing first and second connections, a first pitch length corresponding to the interleaved layout configuration of the first and second string drivers is less than a second pitch length between the first and second string drivers by a predetermined reduction amount when disposed in a non-interleaved layout configuration in which each of the first connections is in-line with the corresponding second connection.

In another exemplary embodiment, an apparatus includes a plurality of memory strings with each memory string including a plurality of local word lines connected to corresponding memory cells to form a memory cell array. The apparatus can include a memory subsystem having a first string driver circuit with first connections and a second string driver circuit with second connections. Each of the first connections and each of the second connections can be adapted to connect to respective local word lines of the plurality of local word lines. The first and second string driver circuits are disposed laterally adjacent to each other in a length direction of the memory subsystem such that each of the first connections is in-line and opposite a corresponding second connection. The corresponding opposing first and second connections can be separated by a deep trench isolation structure. A first pitch length corresponding to a minimum effective distance between the corresponding opposing connection using a deep trench isolation structure can be less than a second pitch length corresponding to a minimum effective distance between corresponding opposing first and second connections using an in-line configuration and a shallow trench isolation structure.

In another exemplary embodiment, an apparatus includes a plurality of memory strings with each memory string including a plurality of local word lines connected to corresponding memory cells to form a memory cell array. The apparatus can include a plurality of word line drivers with each word line driver having at least one sub-driver that includes a first contact connected to a corresponding local word line, a second contact, a gate disposed between the first and second contacts, and a channel region disposed under the gate and disposed between a first lightly dosed drain region and a second lightly dosed drain region. The gate can extend over at least a portion of at least one of the first or second lightly dosed drain regions to form a respective gated lightly dosed drain region adjacent the channel region.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104. A row decoder 108 and a column decoder 110 are provided to decode address signals. Address signals are received and decoded to access memory array 104. Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. For example, the control logic 116 can be in communication with memory subsystem circuits such as the row decoder 108 and the column decoder 110 to control access to memory cells in the memory array 104 in response to the addresses.

Control logic 116 is also in communication with memory subsystem circuits that can include a cache register 118, a data register 120, and/or a circuit-protection subsystem 150. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130. A circuit-protection subsystem 150 can be arranged between data register 120 (and/or cache register 118) and memory array 104. For example, low-voltage circuitry of data register 120 and/or cache register 118 may be coupled to one side (e.g., a low-voltage side) of the circuit-protection subsystem 150 and data lines or bit-lines of memory array 104 may be coupled to another side (e.g., a high-voltage side) of the circuit-protection subsystem 150.

In some embodiments, the control logic 116 and/or the memory subsystems, such as the row decoder circuit 108 and column decoder circuit 110, and/or the other logic circuits for the memory module 100, can be disposed in a periphery area adjacent to the memory array 104. However, in other embodiments, these circuits can be disposed below and within a boundary of the memory array 104 to minimize or eliminate the periphery area (e.g., a zero-periphery die design). Of course, even in a zero-periphery die design, some components such as bond pads may still be located outside the boundary of the memory array 104.

Memory device 100 receives control signals at control logic 116 from processor 130 over a control link 132. The control signals may include at least a chip enable CE #, a command latch enable CLE, an address latch enable ALE, and a write enable WE #. Memory device 100 receives command signals (which represent commands), address signals (which represent addresses), and data signals (which represent data) from processor 130 over a multiplexed input/output (I/O) bus 134 and outputs data to processor 130 over I/O bus 134. For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O at control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments. The configuration of memory array 104 is known to those skilled in the art and thus will not be further discussed except as needed to describe the exemplary embodiments of the present disclosure. For example, embodiments of the present disclosure are described below with reference to a simplified 3D memory array. In addition, although the exemplary embodiments may be discussed in conjunction with a NAND flash architecture, the embodiments described herein are not limited to NAND flash, and exemplary embodiments can include other flash architectures, such as NOR flash, etc.

Figure 2A:
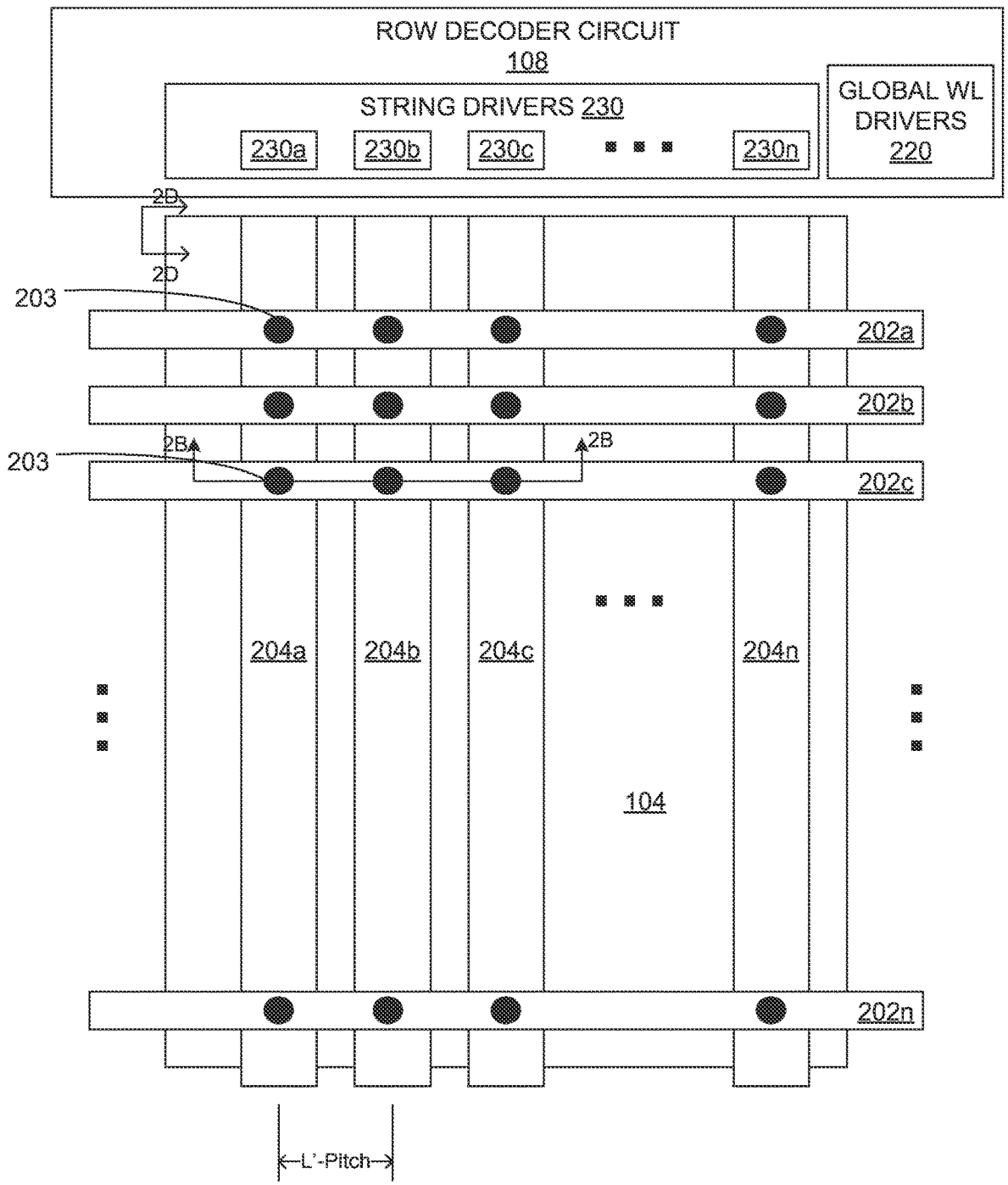
FIG. 2A illustrates a top plan view of a simplified diagram of a memory array circuit in accordance with the present disclosure.

FIG. 2A illustrates a simplified top view of an exemplary embodiment of the memory array 104. FIG. 2B shows a simplified cross-sectional view of a section 2B-2B of the memory array 104 of FIG. 2A. As seen in FIGS. 2A and 2B, the memory array 104, which can be a 3D memory array, can include a plurality of bit lines 202 (e.g., bit lines 202a to 202n) and a plurality of word line groups 204 (e.g., word line groups 204a to 204n). Each of the bit lines 202, which can be activated by column decoder 110, can be connected to one or more bit-line pillars 203 that extend into the 3D memory array 104 as shown in FIG. 2B. Each word line group 204 connects to one or more corresponding bit-line pillars 203. Each word line group 204 has a plurality of local word lines 205, which form at least a portion of a memory string. The row decoder circuit 108 can include global word line drivers 220 and string drivers 230 (e.g., string driver 230a-n) that, in combination with the column decoder 110, are configured to activate one or more memory cells 210 in the memory array 104 for memory operations. The global word line drivers 220 and string drivers 230 can be arranged in a hierarchical circuit configuration in which a global word liner driver 220 is connected to one or more local word line drivers of a string driver 230 to activate one or more local word lines 205. The control logic for row decoder circuits 108 is known in the art and thus, for brevity, will not be discussed except as necessary to discuss embodiments of the present disclosure.

In some embodiments, each word line group 204a-n can be operatively connected a corresponding string driver 230a-n. In some embodiments, the physical layouts of the word line groups 204 and the physical layout of corresponding string drivers 230 can have a physical relationship to each other. For example, the physical relationship can be such that a change in the layout of the word line groups (e.g., dimension(s) and/or arrangement of the word line sections) can mean a corresponding change in the layout of the string drivers (e.g., dimension(s) and/or arrangement of the string drivers). As seen in FIGS. 2A and 2B, the layout of the word line groups 204 corresponds to the layout of the bit-line pillars 203. For example, the word line groups form a 3D grid patterns with the bit-line pillars. In some embodiments, a pitch, L'-pitch, between bit line pillars 203 can correspond to a pitch, L-pitch, between string drivers 230 (see FIG. 2C) such that a change in the L'-pitch will mean a change in the L-pitch. The physical relationship between the pitches of pillars 203 and those of the string drivers 230 can be based on the type/configuration of the memory array 104 and/or memory device 100.

As shown in FIGS. 2A and 2B, memory array 104 can be arranged in a 3D grid structure. The 3D memory array 104 can be composed of alternating local word lines 205, which can be polysilicon films, and isolation layers 207, which can be silicon-oxide films. Memory cells 210 can be formed at the intersections of bit-line pillars 203 and local word lines 205. The configuration of the memory cells 210 can be in the form of, for example, a NAND configuration, with the local word lines 205 forming the control gates of the transistor memory cells 210. Depending on the configuration, other types of configurations such as a NOR configuration, etc., can be used. A plurality of memory cells 210 can be disposed between an SGD (drain side selection gate) transistor 212 and a SGS (source side selection gate) transistor 214 to form a memory string. The SGD transistor 212 connects the memory string to the corresponding bit line 202 and the SGS transistor 214 connects the memory string to the source line 206. Each word line group 204 can include a plurality of memory strings with each memory string corresponding to respective bit line 202 along a word line group 204. FIGS. 2A and 2B show each local word line 205 corresponding to a single row of pillars 203. However, in some embodiments, each local word lines can be a plate that is common to more than one row of pillars 203. Each source line 206 can have a one-to-one correspondence to a bit line 202 or the source line 206 can be a plate that is common to more than one bit line 202. Exemplary embodiments of the present disclosure are not limited to the memory array structure discussed above and other types/configurations of memory array structures (2D/3D) can be used. Because memory array structures are known in the art, for brevity, a more detailed discussion of the structure of the memory array 104 is omitted except as needed to describe embodiments of the present disclosure.

As seen in FIGS. 2C and 2D, the string driver circuit can be configured such that at least one pair of string drivers 230 are arranged laterally adjacent to each other. The string drivers 230 can be connected to respective word line groups 204. Each string driver 230 can include a plurality of local word line drivers 231. Each LWL driver 231 can include two sub-drivers 232a and 232b to drive the corresponding local word lines 205 based on a common global word line signal. In some embodiments, the sub-drivers 232a and the sub-drivers 232b of the string driver 230 can be respectively grouped as a set of sub-drivers A (see dot-dash box) and a set of sub-drivers B (see dotted box) with each set driving the local word lines 205 of a corresponding memory string (or strings). Each sub-driver 232a can include a gate 234a, a local word line (LWL) contact 238a, and a global word line (GWL) contact 236. Similarly, each sub-driver 232b includes a gate 234b, a LWL contact 238b, and a GWL contact 236. In some embodiments, for example as shown in FIG. 2C, the GWL contact 236 is common to both sub-drivers 232a and 232b. In other embodiments, the sub-drivers can be separate and have separate GWL contacts. In some embodiments, each set of sub-drivers A, B can respectively include a common gate 234a,b. For clarity, SGD and SGS drivers for driving the respective SGD transistor 212 and SGS transistors 214 are not shown. However, in some embodiments, the string driver 230 can also include the corresponding SGD and SGS drivers.

The global word line 222 of the global word line drivers 220 can connect to the common GWL contact 236 of sub-drivers 232a,b in one or more string drivers 230. When a global word line 222 is active, the appropriate GWL contact(s) 236 are driven to the active state (e.g., an appropriate high or low voltage value depending on the configuration). As best seen in FIG. 2D, each LWL contact 238a of sub-driver set A can be connected to corresponding local word lines 205, e.g., via contact lines 233. Sub-driver set B can be similarly connected to another string of memory cells 210 (not shown). In some embodiments, instead of a configuration using two sets of sub-drivers, as discussed above, each string driver 230 can be configured to include a single set of sub-drivers. As seen in FIG. 2D, a sub-driver 232a (shaded) of the string driver 230 is turned ON based on its GWL contact 236 being set to an active state (solid shading) and gate 234a (shaded) being set to an appropriate voltage. With sub-driver 232a being ON, the respective LWL contact 238a (solid shading) is set to the active state to drive the appropriate local word line 205 (shaded), which forms the control gate for one or more memory cells 210.

It is desirable to minimize the L'-pitch between bit line pillars 203 in order to manufacture smaller memory devices. However, as discussed above, the physical layout of the string drivers 230 can correspond to the physical layout of the bit line pillars 203 so that, when the L'-pitch of the bit line pillars 203 is reduced, the L-pitch of the string drivers 230 should also be reduced appropriately. In related art systems, the L-pitch between string drivers is already at a minimum pitch between adjacent string drivers or, more specifically, between opposing LWL contacts of the corresponding local word line drivers. This is because the local word line drivers of the string drivers are formed on an active region that is separated and electrically isolated from an opposing active region by an isolation region, and the spacing between the opposing active regions is already at a minimum effective distance. Accordingly, in these related art string drivers, further reduction is not possible without adversely affecting the memory device. As used herein, "effective distance" means 1) the shortest distance between opposing LWL contacts or n+ implants disposed around the opposing LWL contacts (whichever distance is shorter) of laterally adjacent string drivers and/or 2) the shortest distance between opposing edges of active areas of laterally adjacent string drivers and/or 3) the shortest distance between an edge of an active area and an opposing edge of a polysilicon gate of laterally adjacent string drivers. A "minimum effective distance," as used herein, means that a further reduction in the effective distance between the opposing LWL contacts and/or opposing edges of active areas and/or opposing edges of and active area and a gate poly will result in adversely affecting leakage current and/or breakdown voltage (BV) to a point where the leakage current and/or BV falls outside a predetermined design value for the memory device.

Figure 3:
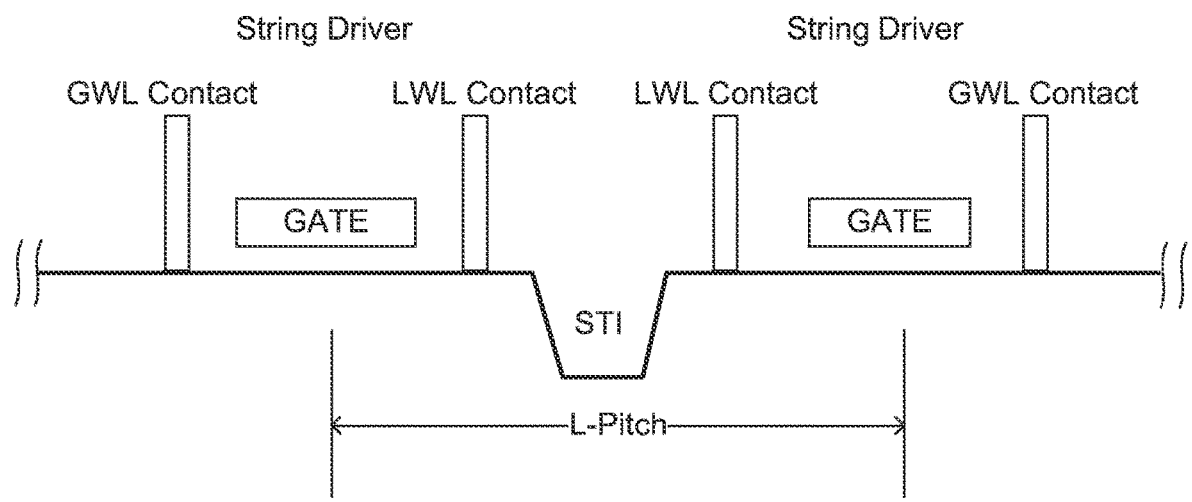
FIG. 3 illustrates a simplified cross-sectional view of local word line driver of a string driver using a shallow trench isolation structure.

FIG. 3 shows a cross-sectional view of opposing sub-drivers as implemented in a related art row decoder circuit with laterally adjacent string drivers. As seen in FIG. 3, the isolation region that electrically isolates the two opposing sub-drivers is a shallow-trench isolation (STI) region, which has a depth of approximately 380 nm. In such a device the minimum L-pitch of the string drivers 230 may be relatively large (e.g., 4.85 µm or greater) in order to avoid breakdown of the sub-driver devices within the string drivers. That is, the opposing LWL contacts are at the minimum effective distance and a further reduction in the L-pitch of the sub-drivers can result in adversely affecting leakage current and/or BV between the opposing LWL contacts.

Figure 4:
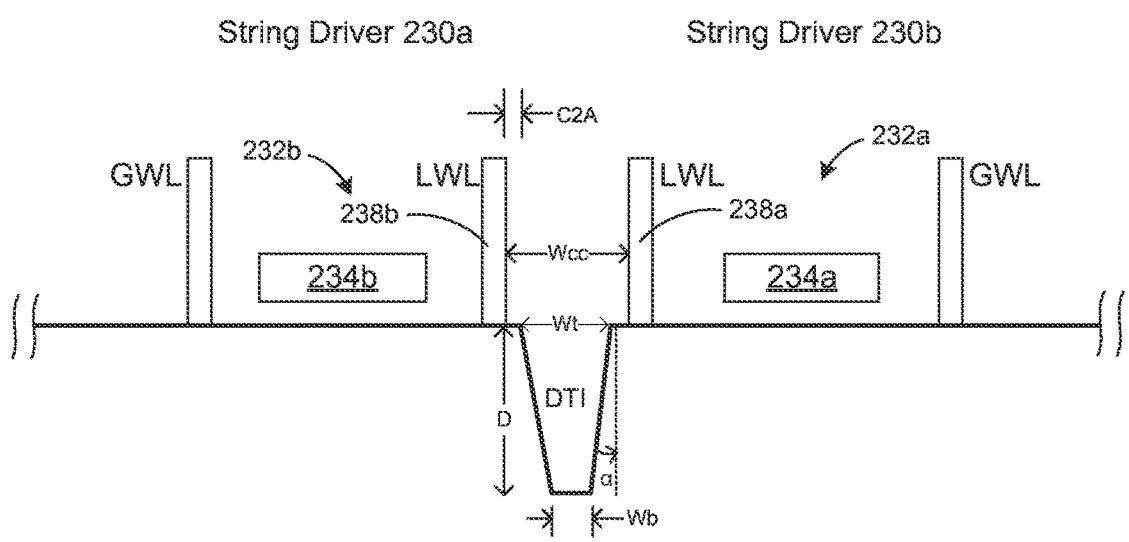
FIG. 4 illustrates a simplified cross-sectional view of section 4-4 of a string driver of FIG. 2C using a deep trench isolation structure in accordance with an embodiment of the present disclosure.

FIG. 4 shows a cross-sectional view of section 4-4 of FIG. 2C that illustrates effective distance between sub-driver 232a and sub-driver 232b of laterally adjacent string drivers 230, as implemented in an embodiment of the present disclosure. As seen in FIG. 4, the sub-drivers 232a and 232b are electrically isolated from each other by using a deep trench isolation (DTI). By using a DTI for the isolation region, the distance between the contact (or N+ implant) to active area (C2A) and the width Wt of the isolation region at top can be reduced in comparison to a STI region. As used herein "contact to active area" or "C2A" is the shorter of the actual contact to active area distance or an N+ implant to active area distance. This reduction means that an effective distance Wcc between corresponding opposing contacts 238a and 238b in laterally adjacent string drivers 230 can be reduced in comparison to a STI region. Because the distance Wcc between contacts of opposing sub-drivers can be reduced using DTI, the L-pitch between the string drivers 230 can also be reduced. For example, the C2A in related art devices can be in a range of 0.25 µm to 0.30 µm and the STI width can be 0.5 µm to 0.6 µm. In exemplary embodiments of the present disclosure, the C2A distance can be near zero such as, for example, approximately 30 nm or less based on the photo process, and the Wt can be in a range of 250 nm to 350 nm such as, for example, 250 nm. In some embodiments, the depth D of the DTI can be in a range of 500 nm to 1000 nm. In some embodiments, the depth D of the DTI can be in a range 600 nm to 800 nm such as, for example, 750 nm. The width Wb of the bottom of the trench can be 166 nm or greater such as, for example, in a range of 166 nm to 186 nm. The sidewall of the trench can have a slope of 30±0.5°. By using a DTI for the isolation region, the L-pitch between laterally adjacent string drivers 230 can be reduced by at least 0.55 µm in exemplary embodiments of the present disclosure where the corresponding opposing LWL contacts 238 are in-line with each other (e.g., string drivers 230 are in a non-interleaved layout configuration as seen in FIG. 2C). For example, for a conventional string driver, the L-pitch can be 4.85 µm and the L-pitch of a string driver in accordance with the present disclosure using DTI can be 4.3 µm or less. However, alternatively or in addition to using DTI, L-pitch reductions in laterally adjacent string drivers 230 can be made by offsetting (in a width direction) the corresponding opposing LWL contacts 238 with respect to each other.

Figure 5A:
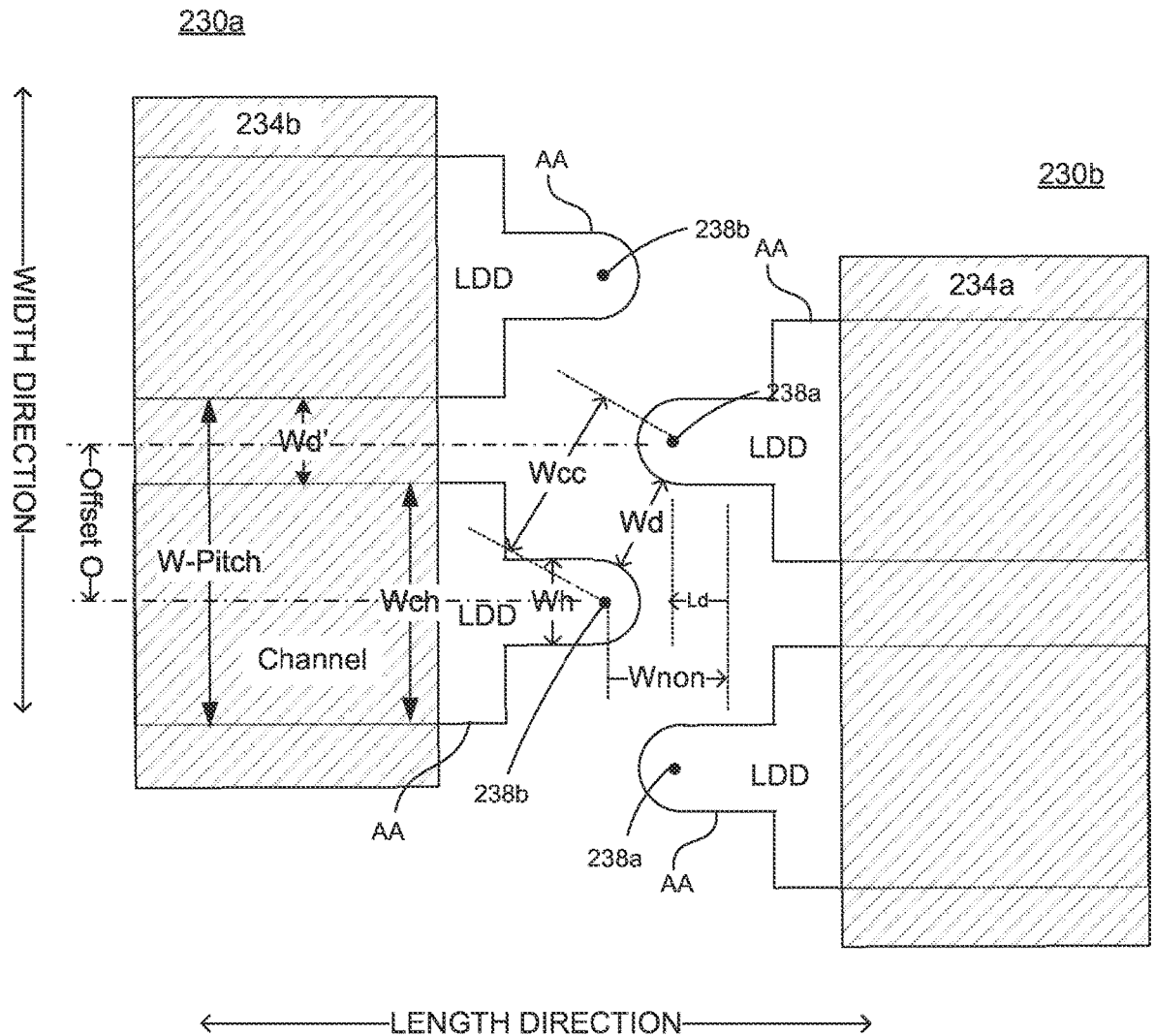
FIGS. 5A to 5C illustrate top views of simplified block diagrams of portions of interleaved string driver arrangements in accordance with various embodiments of the present disclosure.

In the embodiment of FIG. 2B, the LWL contacts 238 of a string driver 230 are in-line with the corresponding opposing LWL contacts 238 of the laterally adjacent string driver 230. In contrast, FIG. 5A illustrates an arrangement of string drivers 230 in which the LWL contacts 238 of a string driver 230 are offset in the width direction with respect to the corresponding opposing LWL contacts 238 of a laterally adjacent string driver 230 (also referred to herein as "interleaved layout configuration"). For purposes of explanation and clarity, only a couple of opposing contacts and only a portion of the drivers are illustrated for each laterally adjacent string driver 230. In addition, the contacts 238 are shown as point contacts within the active area AA (see unshaded active areas), but the contacts 238 can be any appropriate shape and area and can include N+ implants. By offsetting the LWL contacts 238 in the width direction, the string drivers 230 can be arranged closer to each other by a value Ld while still maintaining the BV and/or leakage current within predetermined design values for the memory device, such as, for example, a BV in a range of 25 to 30 volts and/or a leakage current that is in a range of 1 picoamp to 1 nanoamp.

In some embodiments, the active area AA around the LWL contacts 238a,b can be minimized to allow for reduction in the L-pitch. For example, as seen in FIG. 5A, the channels of the sub-drivers 232 can be narrowed from a width of Wch under the gate 234a,b to a width Wh in a contact head around the LWL contact 238a,b. The narrowed width Wh can be formed in, for example, an LDD area (non-shaded area adjacent the channel). In addition, in some embodiments, the active area AA can be formed around the LWL contact 238 with a narrow contact to active area (C2A) edge by using a DTI, as discussed above. The active area pattern around the LWL contacts 238a,b can depend on the shape of the LWL contact such as, for example, a rectangular pattern, an oval pattern, a semicircle pattern, etc. In the embodiment of FIG. 5A, the active area can be formed in a semicircle pattern to correspond to the point contact. The channels can have a width Wch in the gate area of the polysilicon layer (shaded crosshatched) to maintain drive performance. The Wch and Wh values can be based on performance criterial for the sub-drivers 232. In some embodiments, Wch can be approximately 1.2 µm and Wh can be in a range of 0.17 µm to 0.21 µm. However, embodiments of present disclose can have other values for Wch and Wh than those listed here.

W-pitch is the pitch between adjacent sub-drivers 232 of the same string driver 230 and equals the channel width Wch plus the width Wd' of the isolation trench (e.g., DTI or STI) between the sub-drivers. The offset O in the width direction between the two laterally adjacent string drivers 230 can have a range between greater than zero to ½ the W-pitch. For example, in some embodiments, laterally adjacent string drivers 230 are arranged such that one of the string drivers 230 is offset in the width direction in comparison to the other string driver 230 by an offset O that equals ½ the W-pitch. In the interleaved layout configuration, the laterally adjacent string drivers 230 can be arranged closer to each other to reduce the L-pitch in comparison to a non-interleaved layout configuration for the same effective distance between corresponding opposing LWL contacts. For example, if the L-pitch corresponding to a non-offset effective distance between LWL contacts (or n+ implants) of laterally adjacent string drivers is Wnon, an interleaved layout configuration of the string drivers 230 in accordance with embodiments of the present disclosure can reduce the L-pitch for the same effective distance by an amount Ld (new L-pitch equals Wnon−Ld). Accordingly, by reducing the L-pitch beyond that of string drivers that are in-line with each other, exemplary embodiments of the present disclosure provide additional reduction room for the L'-pitch of the bit line pillars 203, which means a smaller memory device. The amount of reduction Ld can be based on the W-pitch value, the Wh value, and the Wcc value as discussed below.

As seen in FIG. 5A, the contact to contact distance between the opposing LWL contacts 238 with the string drivers 230 in the offset arrangement is given by Wcc, which equals Wh+Wd. As discussed above, Wd is the width of the isolation trench (e.g., DTI or STI) between the opposing contacts and Wh is the width of the contact head active area. In some embodiments, Wd equals Wd' and in other embodiment Wd can be greater than or less than Wd'. Similarly, in some embodiments, Wd and Wd' can both correspond the DTI width or the STI width. In other embodiments, Wd can correspond to the DTI width and Wd' can correspond to the STI width or vice versa. In some embodiments, Wd and/or Wh can be set such that Wcc is at the minimum effective distance. In some embodiments, Wd can be in a range of 0.25 µm to 0.35 µm and Wcc can be in a range of 0.42 µm to 0.66 µm.

The amount Ld can be reduced is based on the W-pitch of the string drivers 230 and whether Wcc reaches a minimum design limit (Wcc-min) such as, for example, the minimum effective distance or some other design limit. FIG. 5A represents an exemplary embodiment in which W-pitch can be less than 2*Wcc-min. In such cases, the Wcc value between corresponding opposing LWL contact 238 reaches the limit Wcc-min before the opposing contacts 238 align (or overlap) in the length direction (in some embodiments the tips of the active areas can have some overlap). For example, in FIG. 5A, if W-pitch is less than 2*Wcc-min, Wcc will reach the limit Wcc-min before the LWL 238b aligns with the corresponding opposing contact 238a in the length direction. For a W-pitch less than or equal to 2*Wcc-min, the reduction Ld can equal (Wcc−Sqrt(Wcc$^2$−(W-pitch$^2$/4))). For string drivers with W-pitches ranging from 0.3 µm to 1.32 µm and a Wcc-min that is 0.66 µm, the L-pitch reduction (Ld) (in comparison to a non-interleaved layout configuration) can be in a range 0.017 µm to 0.66 µm. For example, if the W-pitch is 0.7 µm and Wcc-min is 0.66 µm, the L-pitch reduction can be 0.1 µm, and higher reductions can be achieved as the W-pitch increases. Similarly, for string drivers with W-pitches ranging from 0.3 µm to 0.42 µm and a Wcc-min that is 0.42 µm, the L-pitch reduction (Ld) (in comparison to a non-interleaved layout configuration) can be in a range from 0.028 µm up to 0.42 µm. For example, if the W-pitch is 0.55 µm and Wcc-min is 0.42 µm, the L-pitch reduction can be 0.1 µm, and higher reductions can be achieved as the W-pitch increases.

Figure 5B:
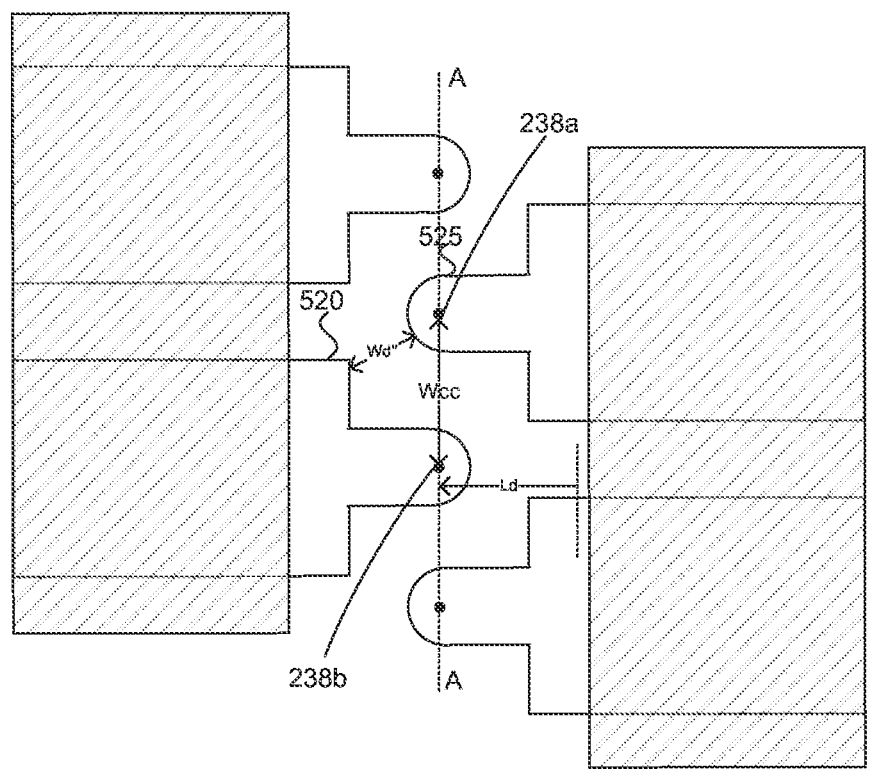
Figure 5C:
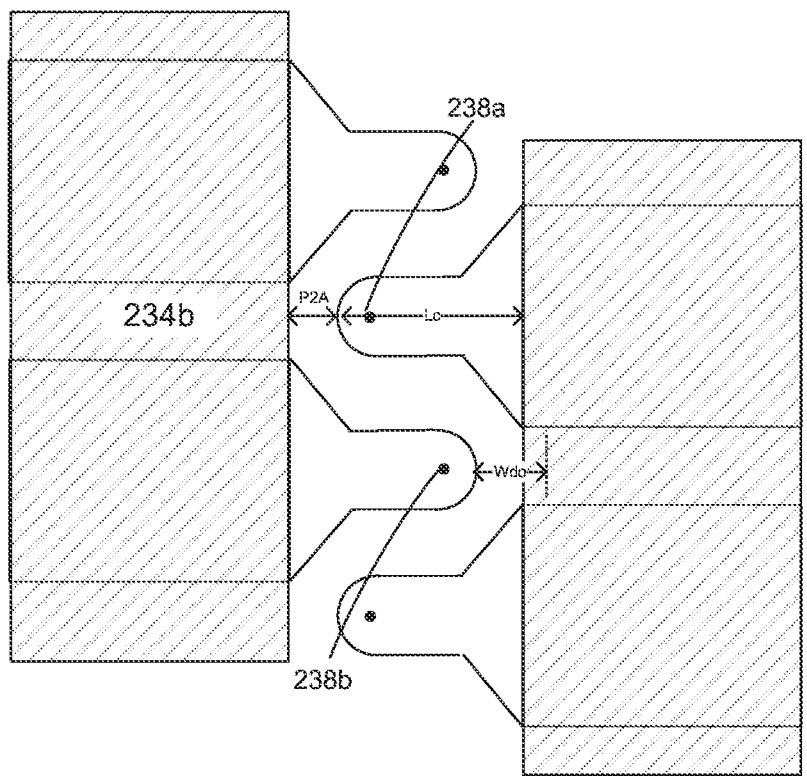

FIG. 5B illustrates a case in which W-pitch is equal to 2*Wcc-min and the Wcc value between corresponding opposing LWL contacts 238a and 238b reaches the limit Wcc-min as the opposing LWL contacts 238a,b align (or overlap) in the length direction (see dotted line A-A). In this embodiment, the reduction Ld is equal to Wcc-min. A limiting factor to further reducing the L-pitch can be the width Wd" of the isolation region between the edge of an active area of a shoulder area 520 of a sub-driver 232 and an edge of an active area of a contact head 525 of an opposing sub-driver 232. If Wd" reaches the minimum effective distance, then a further reduction in the Ld could adversely affect the memory device with respect to BV and/or leakage current. FIG. 5C illustrates an embodiment in which W-pitch is equal to or greater than 2*Wcc-min. Similar to the embodiment in FIG. 5B, the opposing LWL contacts 238a and 238b can overlap with each other. However, unlike the embodiment of FIG. 5B, the shoulder region is removed and/or pushed toward the gate (shaded portion) so that the opposing LWL contacts 238a,b can be located nearer the gate of the corresponding sub-driver 232 in the laterally adjacent string driver 230. As seen in FIG. 5C, the LWL contact 238a can extend up to within a distance P2A of the gate 234b. The area between the gate and contact (corresponding to P2A) can be an isolation region between the active area of the LWL contact 238 and the polysilicon layer of the gate of the opposing sub-driver. A minimal distance is needed to avoid lateral breakdown of the oxide insulator. In some embodiments, the distance P2A can correspond to a minimum effective distance in a range of 0.03 µm or higher.

The Wdo measurement represents the distance between the outer edges of the active areas of the opposing in-line LWL contacts in a non-interleaved layout configuration. The Wdo measurement can correspond to, for example, the width of the isolation region. As seen in FIG. 5C, the reduction Ld from the in-line L-pitch value to the offset L-pitch value is Ld=Wdo+Lc−P2A. For example, if Lc is 0.7 µm and Wdo is 0.35 µm, and P2A is around 0.05 µm, the reduction in the L-pitch can be 1 µm, which translates to a significant reduction in the L-pitch.

The string drivers in the above exemplary embodiments can include conventional sub-drivers. A conventional sub-driver includes a polysilicon gate oxide defining the channel of the gate, and the channel length of the gate can be, for example, 0.7 µm. The gate can include a punch-stop in the center of the channel to mitigate punch through effects. On each side of the gate, the design includes a drain region between the gate and the respective contact (e.g., an LWL contact and a GWL contact). Each drain region receives a N− implant and is known as the LDD region (also known as the drain extension region). The performance of the driver depends on the LDD region resistance and current saturation limits, which are based on the N− dose concentration. However, in the conventional drivers, the LDD dose concentration of the drivers cannot be increased due to BV reduction. Accordingly, while exemplary embodiments of the string drivers discussed above can have a reduced L-pitch in comparison to conventional string drivers, reductions in the width Wch can be limited based on sub-driver performance. If the width Wch can be reduced without sacrificing performance, additional reductions in the L-pitch can be achieved without increasing the W-pitch and/or the W-pitch of the string driver can be reduced to accommodate more word line tiers.

Figure 6:
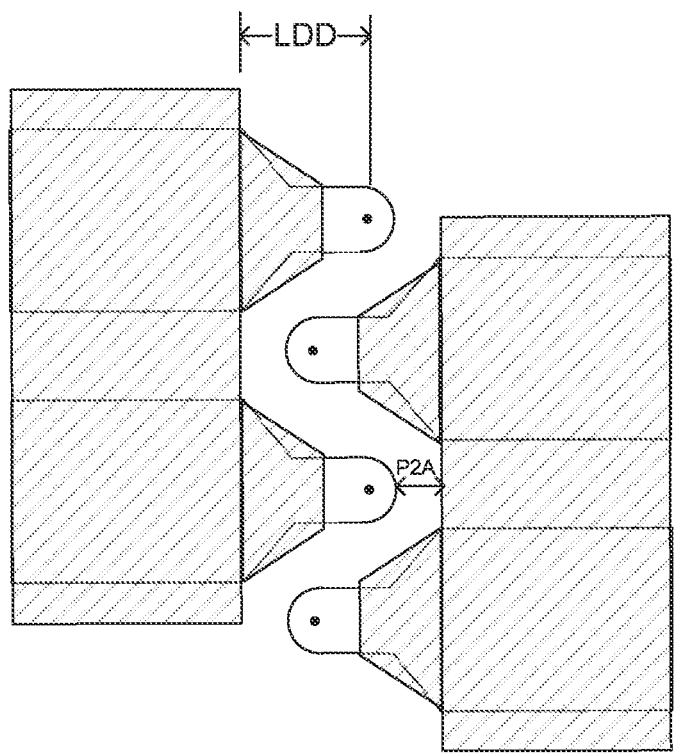
FIG. 6 illustrates a top view of a simplified block diagram of a portion of an interleaved string driver arrangement with a gated LDD configuration in accordance with an embodiment of the present disclosure.

FIG. 6 illustrates an embodiment of the present disclosure in which the sub-drivers 232 have gated LDDs (GLDDs) in accordance with an embodiment of the present disclosure. In GLDD sub-drivers, the polysilicon (shaded area) can extend over at least a portion of the LDD region to near the contact of the sub-driver. By having the polysilicon follow the contours of the active area into the LDD region, the performance of the sub-driver can be improved, which means that the channel width can be reduced. By reducing the width of the channel without a performance loss, the L-pitch between laterally adjacent string drivers and/or the width of a string driver can be further reduced. The string driver configuration in FIG. 6 is similar to that of FIG. 5C, but a string driver with GLDD sub-drivers can have a configuration similar to that shown in FIGS. 5A and/or 5B. The description with respect to the reduction of L-pitch for GLDD sub-drivers is similar to that given above with respect to FIGS. 5A to 5C and thus, for brevity, will not be repeated. In addition, in some embodiment, the laterally adjacent string drivers with GLDD sub-drivers can have a non-interleaved layout configuration such that the opposing LWL contacts are in-line with each other. GLDD sub-driver configuration is discussed further below.

In the above embodiments, as the W-pitch increases, the size of the string drivers 230 in the width direction will also increase. However, in the exemplary embodiments, any increases in the width direction of the string drivers 230 can be offset by an overall size decrease in the memory array 104 due to a decrease in the L'-pitch of the bit line pillars 203. The reductions in the L'-pitch are possible because the offset configuration of the laterally adjacent string drivers allows for reductions in the L-pitch between the laterally adjacent string drivers. In addition, although the isolation region in the offset layout embodiments can be a shallow trench isolation design in the above embodiments, embodiments which incorporate a deep trench isolation design (e.g., around the LWL contacts) can have a further reduction in the L-pitch due to the smaller Wd width. Of course, in some embodiments, the deep trench isolation design can provide an L-pitch reduction even in a non-interleaved layout configuration of the string drivers.

As 3D-memory array designs introduce more word line tiers (e.g., more stacked word lines 205), the string driver area will need to reduce in size in order to minimize the periphery or maintain the zero periphery die design. For example, the size of the string drivers in the width direction may need to be reduced, which can mean reducing the sub-drivers in the width direction. However, as discussed above, a reduction in the width direction in conventional sub-drivers can result in drive performance loss. As discussed further below, the exemplary embodiments of the present disclosure allow for a reduced channel width and thus a reduced string driver width while minimizing and/or eliminating drive performance loss in comparison to conventional string drivers.

In exemplary embodiments of the present disclosure, the string drivers can include GLDD sub-drivers. Those skilled in that understand the details of a fabrication process for a sub-driver and thus, for brevity, details related to photoresist layers, masks, chemical and/or plasma etching, and other known details are omitted. Accordingly, the description with respect to GLDD sub-drivers focuses on the differences from conventional string drivers. In addition, for clarity, the figures are simplified to focus on the differences between conventional string drivers and GLDD string drivers. In GLDD sub-drivers, the polysilicon gate oxide that typically covers only the channel region in conventional sub-drivers is extended over at least a portion of at least one LDD region. An LDD implant, for example a high dose N− phosphorous implant, can then be introduced through the extended portion of the polysilicon gate oxide. In the GLDD sub-driver, the polysilicon extension can function as a field plate over the LDD region as well as helping shield the LDD from coupling to overlying wiring. Because the overlying wiring can be biased unpredictably between 0 volts to approximately 26 volts, the coupling can cause the optimum LDD dose to shift such that the BV v. dose cure has a lower peak, which means that the contact to gate distance must be lengthened to compensate. A polysilicon gate oxide over the LDD region shields the LDD region to mitigate the coupling problem.

As indicated above, the polysilicon gate oxide is extended over at least a portion of the LDD region. In some embodiments, the polysilicon can be extended in the LDD region to a point before a transition zone (see FIG. 7B) where the thick oxide layer transitions to a thin oxide layer near the contact. After the polysilicon gate oxide is deposited and before the gate is etched, the LDD region between the gate channel and the polysilicon gate edge is opened and a through-poly N− LDD implant such as, for example, a high dose N− phosphorous implant is deposited to define the gated LDD region. Alternatively, the LDD implant can be done earlier in the process to allow for lower energy and shallower implant, which should help reduce short channel effects, but such a step can require a carbon co-implant to prevent subsequent deposition steps from diffusing the phosphorous. After the gate is etched, the area around the contact, the ungated LDD portion, gets the traditional self-aligned N− LDD implant. A punch-stop implant can be added in the center of the channel region.

Figure 7A:
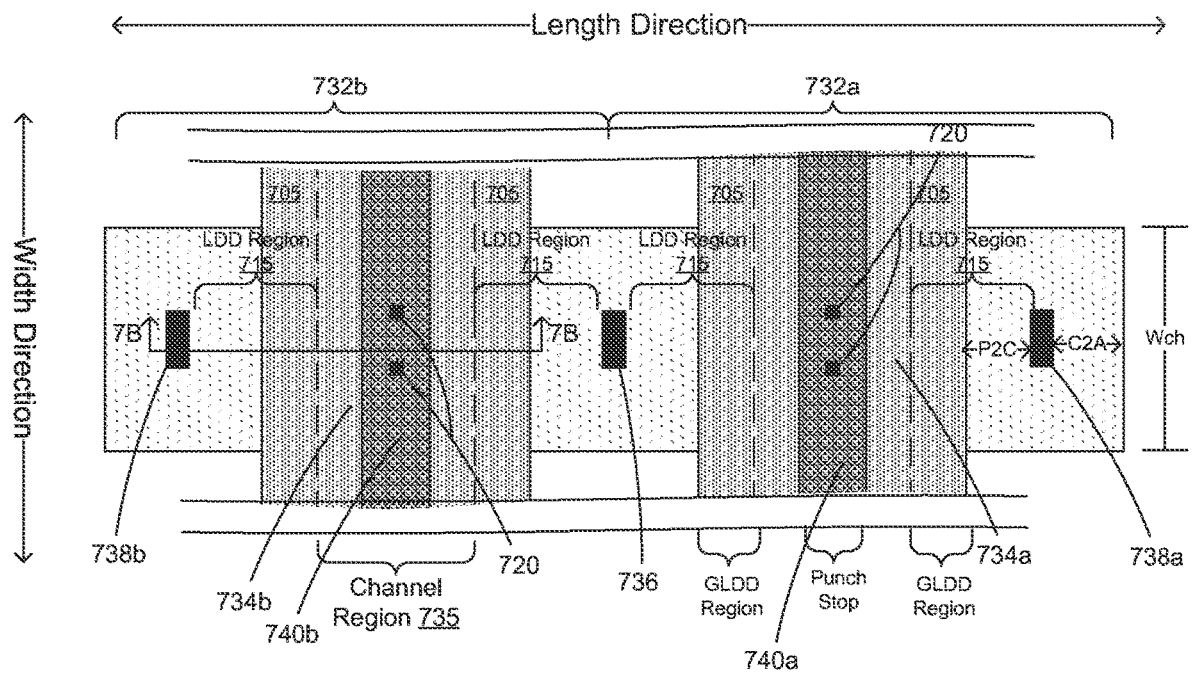
FIG. 7A illustrates a top view of a simplified diagram of a local word line driver of a string driver with a gated LDD configuration in accordance with an embodiment of the present disclosure.
Figure 7B:
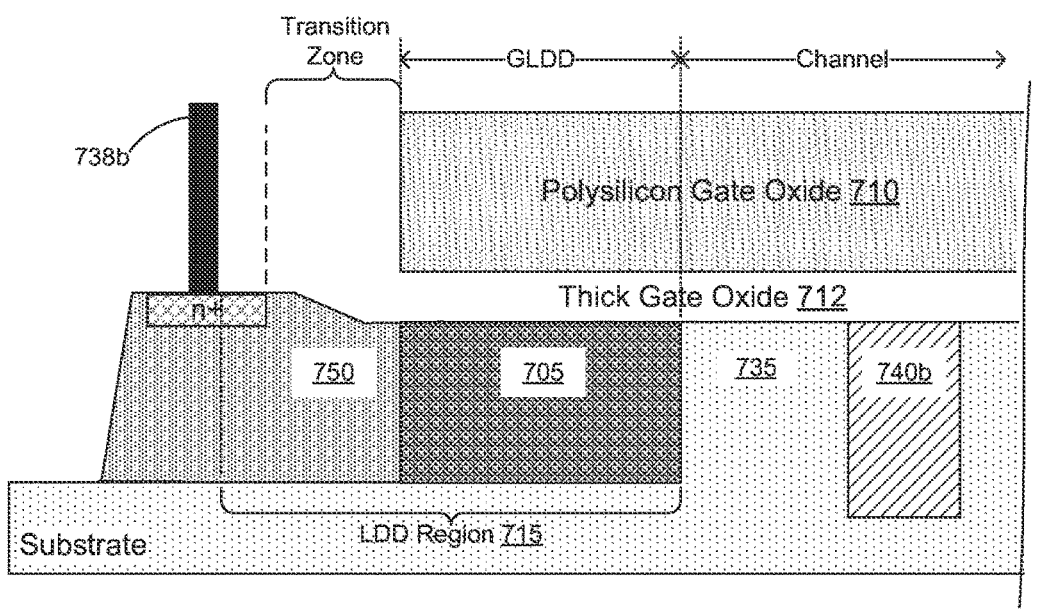
FIGS. 7B to 7D are cross-sectional views of section 7B-7B of the local word line driver of FIG. 7A.

FIG. 7A shows a top view of GLDD sub-drivers 732a,b in accordance with the present disclosure. FIG. 7B shows a cross-sectional view of section 7B-7B of a sub-driver of FIG. 7A. The GLDD sub-drivers 732a,b can be incorporated into the string drivers 230 discussed above. Similar to the above embodiments, the GLDD sub-drivers 732a,b include LWL contacts 738a,b and a common GWL contact 736. In some exemplary embodiments, the distance between an LWL contact 738a,b and the common GWL contact 736 can be approximately 2.27 µm to 2.3 µm, but the contact to contact distance can be different in other embodiments. The LWL and GWL contacts can be formed over an N+ implant such that the N+ implant surrounds the contact and extends beyond the contact on each side, for example, by approximately 42.5 nm in some embodiments. The C2A value for the LWL contacts can be based on whether a STI or a DTI isolation structure is used, and the C2A value can be within the ranges discussed above. The GLDD sub-drivers 732a,b include a respective gate 734a,b that defines a channel region 735 and two gated LDD regions 705, discussed further below. The channel region 735 can be located in a central portion of the sub-driver between the LWL and GWL contacts. The channel region 735 can be, for example, approximately 0.7 to 1.0 µm in length in some embodiments. Each gate 734a,b an include one or more metal contact layers 720, for example located over the channel region 735, for connection to external circuitry. The distance between the edge of the polysilicon oxide of each gate 734a,b and the respective LWL contact 238a,b (P2C value) can be approximately 297.5 nm but can be greater or smaller in other embodiments.

In some embodiments, each gate 734a,b also includes a punch-stop implant 740a,b respectively to minimize body effects such as, for example, punch through and/or short channel effects. The punch-stop implant 740a,b can be approximately 0.22 µm thick (top view). In exemplary embodiments, based on the higher LDD dopant level in the GLDD regions 705 (discussed below), the punch-stop implant can have a higher dose than a conventional punch-stop dose to minimize the body effects such as, for example, punch through and/or short channel effects. In some embodiments, the LDD implant in the GLDD regions 705 can be shallower than in a conventional driver and can include a co-implant such as, for example, carbon (e.g., to suppress phosphorous diffusion).

Similar to conventional sub-drivers, LDD regions 715 are formed on either side of each gate 734a,b. The length of each LDD region 715 can be, for example, in a range from 0.65 µm to 0.8 µm in some embodiments but can be greater than 0.8 µm or smaller the 0.65 µm in other embodiments. However, as seen in FIGS. 7A and 7B, unlike the conventional string drivers, polysilicon gate oxide 710 is extended over at least a portion of at least one LDD region 715. For example, the polysilicon gate oxide 710 is extended over at least a portion of the respective LDD regions 715 between the gate 734a,b and the appropriate LWL or GWL contact. In some embodiments, the polysilicon gate oxide 710 is extended to the transition zone in the LDD region prior to the LWL contact. In some embodiments, the polysilicon gate oxide 710 can be extended to a predetermined point prior to the transition zone. The LWL contact can be formed over an N+ implant area to provide a region of low resistivity around the LWL contact to ensure better and more reliable connections. The N+ implant can extend beyond the contact on each side, for example, by approximately 42.5 nm in some embodiments. The transition zone is an area where the thick gate oxide 712 transitions to a thinner oxide layer prior to the contact. To minimize oxide time dependent dielectric breakdown (TDDB) problems, high contact resistance and/or leakage problems, in some embodiments, the polysilicon gate oxide 710 does not extend to the transition zone.

In some embodiments, the implant dose concentration in the GLDD portion 705 can be, for example, approximately 4.2 to 4.7 times (e.g., approximately 4.5 times) the dose concentration of the ungated LDD portion 750. For example, in some embodiments, the GLDD portion 705 under the polysilicon gate oxide 710 can have a dedicated N− implant (e.g., phosphorous based) that has a dose concentration in a range of 2.0 to $2.2*10^{13}/cm^3$, and the ungated LDD portion 750, which is not under the polysilicon gate oxide 710, can have a traditional self-aligned N− implant having a dose concentration in a range of 4.5 to $4.7*10^{12}/cm^3$. The dedicated GLDD implant of GLDD portion 705 can be electrically continuous with the LDD implant of ungated LDD portion 750. Although given with respect to the GLDD on the LWL contact side for sub-driver 732b, those skilled in the art will recognize that the above description also applies to the GLDD on the GWL contact side of sub-driver 732b and also for sub-driver 732a. Thus, for brevity, the discussion regarding doping concentrations will not be repeated.

Figure 7C:
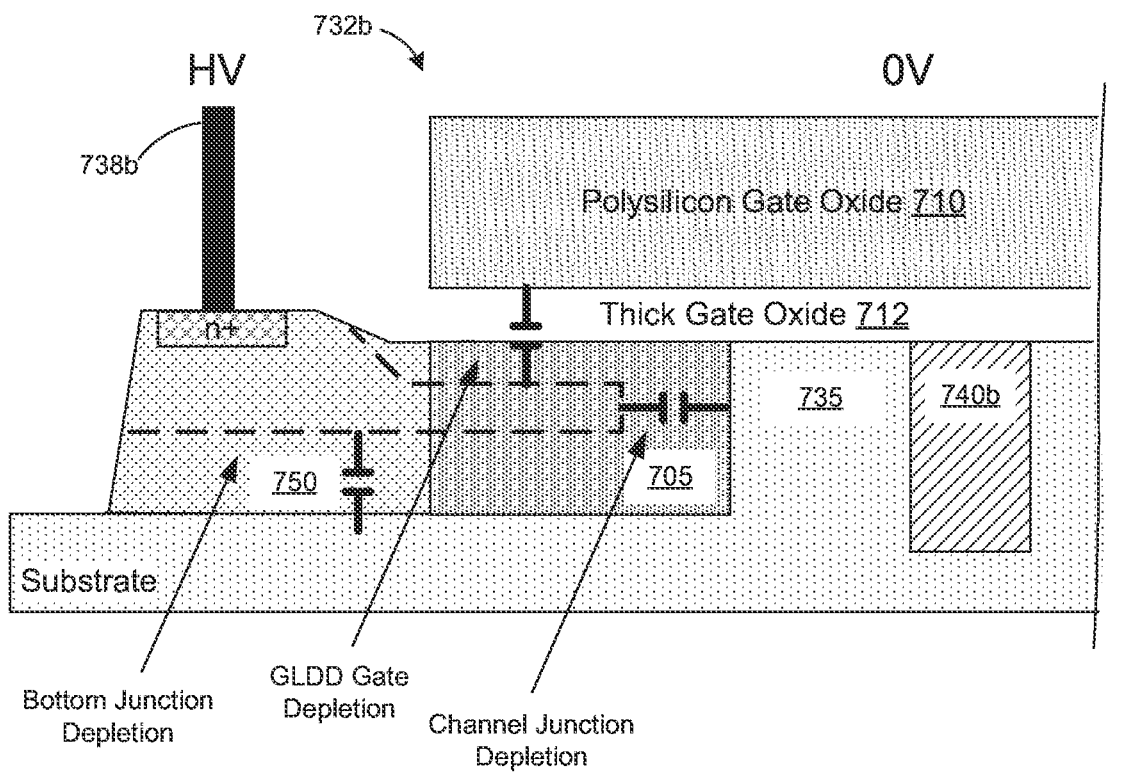

Exemplary embodiments of GLDD sub-drivers, as discussed above, reduce the resistance of the LDD region 715, which improves the drive performance. The lower resistance can be attributed to the increased dopant concentration in the GLDD region 705, which is, for example, 4.2 to 4.7 times the dose concentration of a conventional LDD implant. The increased dopant concentration in the GLDD region 705 helps maintain a high BV between the source and drain when the driver is blocking the voltage from passing when in, for example, an off state, a grounded state, and/or when the drain or source is at a high voltage. As seen in FIG. 7C, the sub-driver 732b is in an off state with the LWL contact 738b at a high voltage HV and the gate at zero voltage. The dotted line represents the boundary of the depletion zone, which is depicted by the capacitance symbols. In the ungated LDD portion 750, conventional depletion takes place starting at the bottom junction with the substrate. Similarly, conventional depletion takes place starting at the channel junction. In the GLDD portion 705, conventional depletion takes place at the bottom junction, but in addition, there is depletion at the LDD gate (e.g., the junction with the silicon surface), which forms a poly gate capacitance. Due to the depletion effect from the LDD gate, a high dopant concentration (as discussed above) is needed in the GLDD region 705 to block the high voltage and still maintain the BV and/or leakage current within acceptable limits.

Figure 7D:
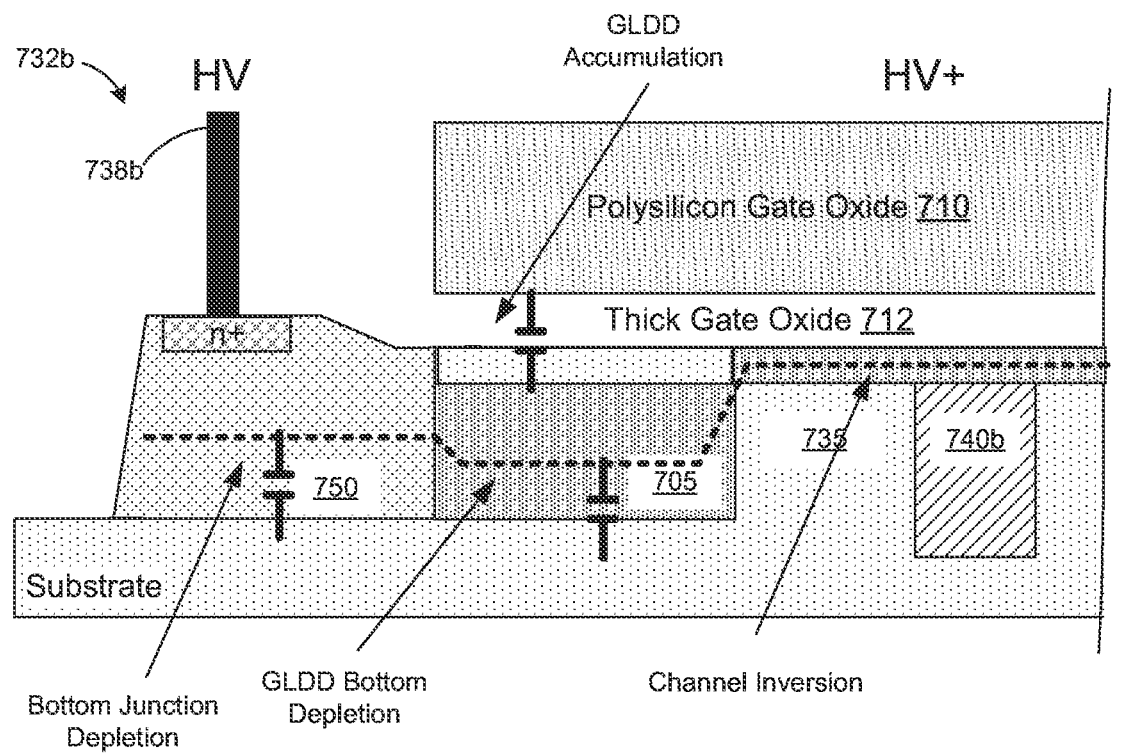

FIG. 7D illustrates the sub-driver 732b in the on state (e.g., voltage pass condition, programming state). The LWL contact is at a high voltage but, in this case, the gate is at higher voltage. In this situation, channel inversion occurs and the drain to source current Ids and the voltage are passed through. As seen in FIG. 7D, conventional depletion occurs at the bottom junction in ungated LDD portion 750. In the GLDD portion 705, depletion occurs at the bottom junction but at a lower level because the N− dose concentration is higher. Because there is less depletion, the resistance is lower in comparison to a region with conventional doping concentrations. In addition, the lower resistance in the GLDD portion 705 can also be attributed to an accumulation charge at the LDD gate caused by an override of the polysilicon, which forms a poly gate capacitance. The reduced resistance of the GLDD sub-driver can translate to improved performance for a given channel width and/or a reduced channel width for a given performance criteria. For example, for a given channel width, string drivers with GLDD sub-drivers in accordance with the present disclosure will perform better than conventional string drivers. The performance improvement can translate to a page program time (Tprog) improvement. Based on the applied bias voltage, exemplary embodiments the drive current in GLDD sub-drivers can be 1.3 to at least 3 times greater than the drive current in conventional sub-drivers, which do not have gated LDD regions. For example, based on the global word line voltage $V_{GWL}$, the ratio R of the current Ids in a GLDD sub-driver to that in an ungated LDD sub-driver can be in a range of 1.3 to at least 3.0. The ratio R can be dependent on the bias voltage. For example, if $V_{GWL}$ is less than 15 volts, the ratio R can be approximately 1.3 and, as $V_{GWL}$ increases to 25 volts, the ratio R can increase to at least 3.0. Because the GLDD sub-drivers have better performance, for a given drive current, the width of the active area in GLDD sub-drivers can be reduced by a corresponding amount. For example, if the GLDD sub-driver provides a 2× improvement in the drive current, the width of the active area of the sub-driver can by reduced by one-half without sacrificing performance. Thus, in the above exemplary embodiments, the L-pitch of string drivers can be reduced to accommodate a reduced L'-pitch of the bit lines 203, for example, and/or the W-pitch of the string drivers can be reduced to accommodate additional tiers of word lines, for example.

Although specific embodiments have been illustrated and described herein, it will be appreciated by those of ordinary skill in the art that any arrangement that is calculated to achieve a similar (e.g., the same) purpose may be substituted for the specific embodiments shown. For example, the GLDD design, the DTI design, and/or the interleaved design can be used in any combination to achieve L-pitch reduction, W-pitch reduction, and/or performance improvement of drivers. In addition, exemplary embodiments of the present disclosure are described with respect to string driver circuits for word lines. However, those skilled in the art will understand that the teachings of the present disclosure can be applicable to other types of transistor/driver circuits where length and/or pitch reduction and/or performance improvement is desirable.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps may be presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

The processing device (e.g., processor 130 and/or another controller) represents one or more general-purpose processing devices such as a microprocessor, a central processing circuit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., processor 130 and/or another controller) can also be one or more special-purpose processing devices such as an application specific integrated circuit (ASIC), a field programmable gate array (FPGA), a digital signal processor (DSP), network processor, or the like.

The machine-readable storage medium (also known as a computer-readable medium) on which is stored one or more sets of instructions or software embodying any one or more of the methodologies or functions described herein. The machine-readable storage medium can be, for example, memory device 100 or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus, comprising:
   a plurality of memory strings, each memory string including a plurality of local word lines connected to corresponding memory cells to form a memory cell array; and
   a plurality of word line drivers, each word line driver having at least one sub-driver that includes,
   a first contact connected to a corresponding local word line,
   a second contact,
   a gate disposed between the first and second contacts, and
   a channel region disposed under the gate and disposed between a first lightly dosed drain (LDD) region and a second LDD region,
   wherein the gate extends over at least a portion of at least one of the first or second LDD regions to form a respective gated lightly dosed drain (GLDD) region adjacent the channel region.

2. The apparatus of claim 1, wherein the gate extends over a portion of the first LDD region to form a first GLDD region adjacent to the channel region and a first ungated LDD region adjacent to the first GLDD region on a side opposite the channel region, and the gate extends over a portion of the second LDD region to form a second GLDD region adjacent to the channel region and a second ungated LDD region adjacent to the second GLDD region on a side opposite the channel region, and
   wherein the first contact is disposed over the first ungated LDD region and the second contact is disposed over the second ungated LDD region.

3. The apparatus of claim 2, wherein the first and second gated LDD regions have an N-implant that is 4.2 to 4.7 times the dose concentration of the respective first and second ungated LDD regions.

4. The apparatus of claim 3, wherein the N-implant is a phosphorous implant.

5. The apparatus of claim 2, wherein the first and second gated LDD regions have an N-implant that is in a range of 2.0 to $2.2*10^{13}/cm^3$.

6. The apparatus of claim 5, wherein the first and second ungated LDD regions have an N-implant that is in a range of 4.5 to $4.7*10^{12}/cm^3$.

7. The apparatus of claim 2, wherein each word line driver includes a first sub-driver and a second sub-driver,
   wherein the second contact is common to both the first and second sub-drivers and the second contact is connected to a global word line driver.

8. The apparatus of claim 7, wherein for a same width for the channel region and a same dose concentration for ungated LDD regions, based on a bias voltage on the second contact, a drive current of the word line driver is 1.3 to at least 3 times a drive current of a word line driver having only ungated LDD regions.

9. The apparatus of claim 1, wherein the gate includes a punch-stop implant.

10. The apparatus of claim 1, wherein an N+ implant surrounds each of the first and second contacts.

* * * * *